United States Patent
Nogami

[11] Patent Number: 5,916,411
[45] Date of Patent: Jun. 29, 1999

[54] DRY ETCHING SYSTEM

[75] Inventor: Youichi Nogami, Nagasaki, Japan

[73] Assignee: Sony Corporation, Japan

[21] Appl. No.: 08/661,781

[22] Filed: Jun. 13, 1996

[30] Foreign Application Priority Data

Jun. 21, 1995 [JP] Japan .................................. 7-178099

[51] Int. Cl.$^6$ .............................. H05H 1/00; H01L 21/00
[52] U.S. Cl. ........................................................ 156/345
[58] Field of Search ...................... 156/345; 118/723 E; 204/298.32

[56] References Cited

U.S. PATENT DOCUMENTS

| | | | |
|---|---|---|---|
| 4,971,653 | 11/1990 | Powell et al. | 156/345 X |
| 5,155,331 | 10/1992 | Horiuchi et al. | 156/345 X |
| 5,290,381 | 3/1994 | Nozawa et al. | 156/345 |

Primary Examiner—Thi Dang
Attorney, Agent, or Firm—Rader, Fishman & Grauer; Ronald P. Kananen

[57] ABSTRACT

An etching system for manufacturing a semiconductor device includes: a carbon electrode provided in a reactor chamber; a cooling device for cooling the carbon electrode; a temperature sensor for detecting the temperature of the carbon electrode; a heat-insulator provided in such a manner as to cover the outer peripheral portion of the temperature sensor for preventing the temperature sensor from being thermally affected by a portion other than the carbon electrode; and a controller, connected to the temperature sensor, for controlling the cooling device on the basis of a detection signal outputted from the temperature sensor. This etching system controls the supply amount of carbon from the carbon electrode introduced into plasma for stabilizing an etching process.

18 Claims, 2 Drawing Sheets

DRY ETCHING SYSTEM

BACKGROUND OF THE INVENTION

The present invention relates to an etching system for forming a thin film pattern on a semiconducting substrate, and, more particularly, to a cooling means for cooling an amorphous carbon electrode of an etching system for manufacturing a semiconductor device.

A reactive ion system (RIE) is used in a process of manufacturing semiconductor devices such as LSIs and transistors. Such an etching system etches, by a necessary thickness, the entire area or a specified area of a thin film (metal electrode film or insulating oxide film) formed on the surface of a wafer by the synergistic effect of radicals and reactive ions in a reactive gas plasma. In this etching system, a reactor chamber contains an upper electrode (carbon electrode) made of amorphous carbon and a lower electrode on which a wafer is mounted in such a manner as to face the upper electrode; and a reaction gas such as $CH_4$, $CHF_3$ or Ar is supplied in the chamber at a specified pressure. A high frequency power is applied to the carbon electrode in such a state for forming a plasma region between the carbon electrode and the lower electrode, to etch a wafer mounted on the lower electrode by chemical reaction with radicals and reactive ions in plasma. This etching system is provided with a cooling device on the upper portion of the carbon electrode for holding constant the temperature in the reactor chamber and holding constant an etching condition, and a refrigerant (cooling water) controlled at a specified temperature (for example, 25° C.) in a thermostatic chamber (refrigerator) is circulated in the cooling device.

The above etching system, however, has only carried out temperature control of a refrigerant (cooling water) by detecting the refrigerant in a thermostatic chamber and driving the refrigerator so as to hold constant the temperature of the refrigerant, particularly has not carried out temperature control of a carbon electrode at constant temperature. As a result, the above etching system has presented the following inconveniences. Namely, as shown by a line "b" in FIG. 1, when an etching processing time becomes longer, the temperature of the carbon electrode itself is increased by plasma discharge, to increase the supply amount of carbon from the carbon electrode introduced into the plasma. This increases a ratio of deposition of carbon on a wafer, to reduce an etching rate as shown by a line "a" in FIG. 1, causing variations in uniformity and selectivity of etching on the surface of the wafer in a lot. Thus, the etching condition is varied and the film thickness and shape are made non-uniform. This exerts adverse effect on device characteristics.

OBJECT AND SUMMARY OF THE INVENTION

An object of the present invention is to provide an etching system for manufacturing a semiconductor, which is capable of holding constant the temperature of a carbon electrode for controlling the supply amount of carbon from the carbon electrode into plasma thereby stabilizing an etching process.

To achieve the above object, according to a preferred mode of the present invention, there is provided an etching system for manufacturing a semiconductor device, including: a carbon electrode provided in a reactor chamber; a cooling device for cooling the carbon electrode; a temperature sensor for directly detecting the temperature of the carbon electrode; a heat-insulator provided in such a manner as to cover the outer peripheral portion of the temperature sensor for preventing the temperature sensor from being thermally affected by a portion other than the carbon electrode; and a controller, connected to the temperature sensor, for controlling the cooling device on the basis of a detection signal outputted from the temperature sensor.

The above carbon electrode is preferably made of amorphous carbon.

The temperature of a carbon electrode is directly detected by a temperature sensor, and the drive of a cooling system (thermostatic chamber) is controlled by a controller (CPU) so as to hold constant the temperature of the carbon electrode on the basis of the detected temperature, to thereby control the temperature of a refrigerant (cooling water). This makes it possible to hold constant the temperature of the carbon electrode, and hence to control the supply amount of carbon from the carbon electrode into plasma at constant. Consequently, the etching is balanced against the deposition of carbon on a wafer, to be thus stabilized. In other words, the etching rate is held constant, to thereby preventing variations in uniformity and selectivity of etching in a lot.

DETAILED DESCRIPTION OF THE PREFERRED EMBODIMENT

The present invention will be described in detail by way of example with reference to the drawings.

Figure 1:
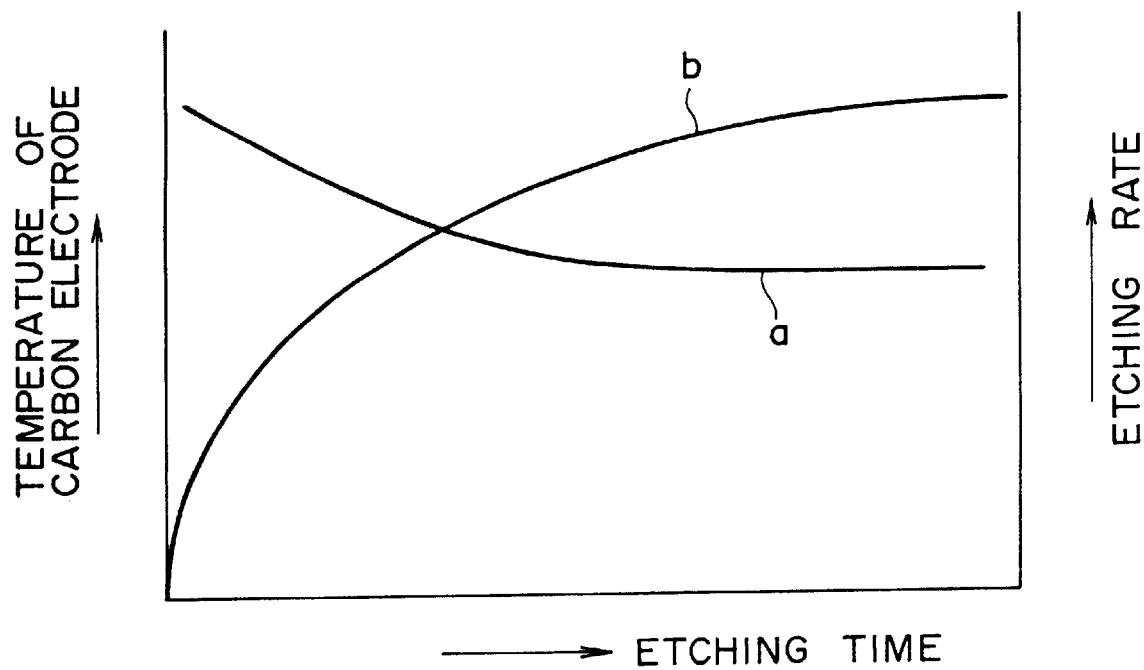
FIG. 1 is a graph showing a relationship between an etching processing time, and the temperature of a carbon electrode and an etching rate in a related art etching system.
Figure 2:
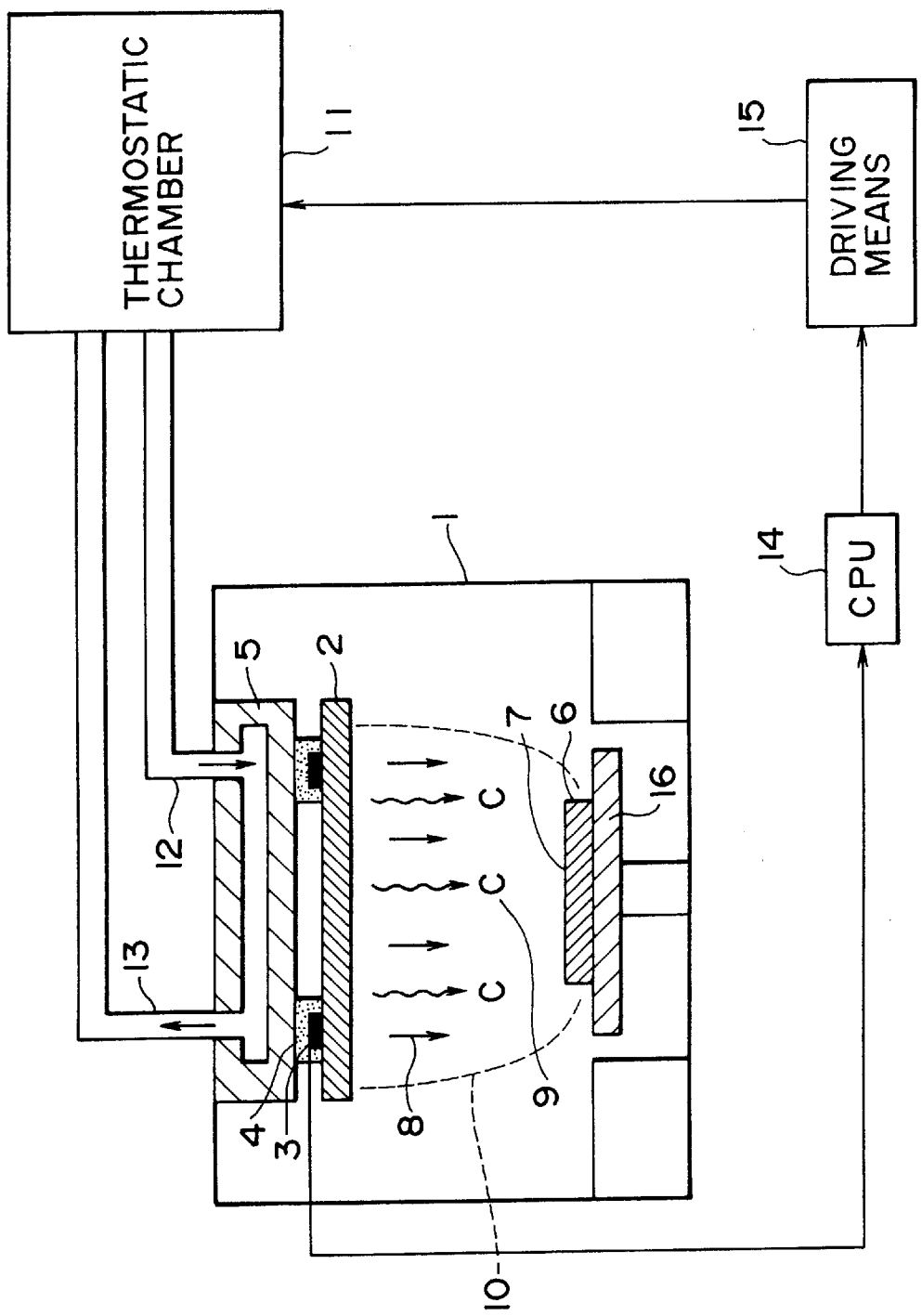
FIG. 2 is a schematic view showing the configuration of an etching system of the present invention.

FIG. 2 is a schematic view showing the configuration of an etching system of the present invention, in which a carbon electrode, preferably, an amorphous carbon electrode 2 is provided on the upper portion of a reactor chamber 1.

The carbon electrode is formed into a circular shape which has, for example, a thickness of from 3 to 4 mm and a diameter of 30 cm for a 6-inch wafer. Such an outer dimension of the carbon electrode is set to be larger than that of a stage 16 for supporting a wafer 7. A temperature sensor 3 for directly detecting the temperature of the carbon electrode 2 is provided in such a manner as to be in contact with the carbon electrode 2.

In the case where an amorphous carbon electrode is formed, for example into a circular shape, the area of the electrode becomes larger. For such a circular amorphous carbon electrode, two or more of the temperature sensors 3 are desirable to be provided for increasing the number of the temperature measurement points on the surface of the electrode to the utmost and reducing non-uniformity in temperature on the surface of the electrode.

The temperature sensor 3 is covered with a heat-insulator 4 for preventing detection of the temperature sensor 3 for the temperature of a portion other than the carbon electrode 2.

The heat-insulator is made of a material selected from ceramic, PTFE (polytetrafluoroethylene), and glass fiber.

The covering of the upper, right and left sides of the above temperature sensor with this heat-insulator allows the heat transfer from the amorphous carbon electrode to the temperature sensor and also prevents heat radiation from the temperature sensor to the interior of the reactor chamber 1.

A cooling device 5 for holding constant the temperature of the carbon electrode 2 is provided on the upper portion of the carbon electrode 2. A refrigerant (cooling water) from a thermostatic chamber 11 provided outside the reactor chamber flows in the cooling device 5 through a refrigerant inlet 12 by way of a pipe as shown by an arrow, and it flows out of a refrigerant outlet 13 as shown by an arrow to be returned into the thermostatic chamber 11 by way of a pipe. The refrigerant is thus circulated in the cooling device 5. In addition, the lower portion of the cooling device 5 is practically provided in such a manner as to be in contact with the carbon electrode 2.

On the other hand, the upper portion of the cooling device 5 is closely fixed, for example, on the upper wall surface of the reactor chamber 1. The refrigerant inlet 12 through which the refrigerant (cooling water) is supplied is mounted in the outer wall surface of the reactor chamber 1, while the refrigerant outlet 13 through which the refrigerant is discharged is mounted in the outer wall surface of the reactor chamber, so that the refrigerant is circulated in the cooling device 5 for effectively cooling the upper portion, at which temperature is raised, of the reactor chamber 1. The cooling device 5 thus acts to cool the interior of the reactor chamber 1 and to decrease the temperature thereof; however, in this case, if the temperature sensor is directly cooled, there occurs a difference between the temperature of the interior of the reactor chamber and the temperature of the amorphous carbon electrode. This causes an inconvenience that an etching condition is different from a predetermined one, with a result that there arises a manufacturing failure such as under-etching or over-etching of a workpiece, for example, a wafer.

To prevent such a failure, that is, to accurately measure the setting temperature of the amorphous carbon electrode without any effect exerted from the cooling device 5 and the like, the heat-insulator 4 is provided between the cooling device 5 and the temperature sensor 3.

The heat-insulator 4 functions not only to cover the temperature sensor 3 for preventing heat radiation therefrom, but also to fix the amorphous carbon electrode 2 to the cooling device 5 mounted on the upper wall surface of the reactor chamber 1.

A workpiece, for example, a wafer 7 is located at a lower position facing the amorphous carbon electrode 2 in such a manner as to be fixed on a lower electrode 6.

An electric signal detected by the temperature sensor 3 is transferred outside the reactor chamber 1 and is supplied to a data processing means (CPU 14 in this example) using an external computer or the like.

The CPU 14 previously sets an etching condition including an etching time, etching temperature, flow rate of a reaction gas, and the like. In particular, the CPU 14 in this example is so constructed as to carry out the following temperature control.

Namely, the CPU 14 receives an electric signal converted from a detected temperature and produces a control signal depending on whether the data is higher or lower than a set point, and it supplies the control signal to a driving means 15 subsequent to the CPU 14.

The driving means 15 controls the temperature of the thermostatic chamber 11 provided outside the reactor chamber 1 on the basis of the control signal supplied from the CPU 14.

For example, when an etching processing time becomes longer and the temperature of the carbon electrode is raised, a variation in temperature rise is directly detected by the temperature sensor 3 provided on the carbon electrode 2. The detected temperature is converted into an electric signal and is supplied to the CPU 14. The CPU 14 calculates the set point temperature of the refrigerant (cooling water) on the basis of the electric signal, and the thermostatic chamber 11 is driven by the driving means 15 on the basis of the information of the CPU 14 so that the temperature of the refrigerant (cooling water) is decreased to the setting temperature calculated by the CPU 14.

As the temperature of the interior of the thermostatic chamber 11 is decreased by the drive of the driving means 15, the refrigerant (for example, cooling water) is cooled correspondingly. The refrigerant thus cooled enters the refrigerant inlet 12 of the cooling device 5, being circulated in the cooling device 5, and is discharged from the refrigerant outlet 13. The refrigerant, which is heated in the reactor chamber, is then returned in the thermostatic chamber to be cooled therein. This process is repeated to set the temperature of the interior of the reactor chamber 1 at the setting temperature.

On the other hand, as an etching processing time is shorter and the temperature of the carbon electrode is decreased, a process reversed to the above is set at the CPU 14, driving means 15, and thermostatic chamber 11 so as to heat the interior of the reactor chamber 1 up to the set temperature. The temperature of the carbon electrode 2 is thus held constant.

The lower electrode 6 is provided on the lower side of the reactor chamber 1 in such a manner as to face the carbon electrode 2, and the wafer 7 to be etched is mounted on the lower electrode 6. A high frequency power is applied to the carbon electrode 2, to form a plasma region 10 between the carbon electrode 2 and the lower electrode 6. Thus, carbon of the carbon electrode 2 is discharged as carbon plasma 9, as shown by an arrow. A reaction gas supply port (not shown) is formed in the reactor chamber 1, and a reaction gas 8 flows from top to bottom in the chamber as shown by an arrow. In addition, while not shown, an evacuation port is also provided in the reactor chamber 1.

For example, in the case where a contact hole is formed in a silicon oxide film ($SiO_2$) formed on a silicon substrate by the above-described etching system, the etching is performed by the steps of coating the surface of the silicon oxide film with a resist; introducing a mixed reaction gas of $CF_4$ (flow rate: 60 SCCM), $CHF_3$ (60 SCCM) and Ar (900 SCCM) in the reactor chamber; and applying a high frequency power of 750 W to the carbon electrode and setting the vacuum pressure in the reactor chamber at 1.7 Torr, thus etching the silicon oxide film on the basis of a resist pattern.

In this etching processing, as described above, the temperature of the carbon electrode 2 can be usually held constant because the temperature of a refrigerant (cooling water) is variable in the thermostatic chamber 11 depending on a temperature rise of the carbon electrode 2. The amount of carbon in the plasma can be thus held constant, so that the etching rate can be held constant and thereby the etching processing can be stably carried out irrespective of the etching processing time.

According to the etching system of the present invention, as described above, the temperature of the carbon electrode can be held constant even when the etching processing time becomes longer, so that the amount of carbon introduced into plasma can be kept constant and thereby the etching rate can be held constant. This makes it possible to improve uniformity of etching on the surface of a wafer and hence to stabilize etching characteristics such as anisotropy and selectivity in a lot. Accordingly, an etching process can be stably carried out with an etching shape, film thickness and the like held constant, which leads to semiconductor products usually exhibiting specified characteristics.

While the present invention has been described by way of the preferred example, such description is for illustrative purposes only, and it is to be understood that changes and variations may be made without departing from the spirit or scope of the following claims.

What is claimed is:

1. An etching system for manufacturing a semiconductor device, comprising:

a carbon electrode provided in a reactor chamber;

a cooling device for cooling said carbon electrode, said cooling device in thermal contact with said carbon electrode to effect cooling thereof;

a temperature sensor for detecting the temperature of said carbon electrode;

a heat-insulator covering portions of said temperature sensor for preventing said temperature sensor from being thermally affected by heat from other than said carbon electrode; and a controller, connected to said temperature sensor, for controlling said cooling device on the basis of a detection signal outputted from said temperature sensor.

2. An etching system for manufacturing a semiconductor device according to claim 1, wherein said carbon electrode is amorphous carbon.

3. An etching system for manufacturing a semiconductor device according to claim 1, wherein said temperature sensor is in contact with said carbon electrode.

4. An etching system for manufacturing a semiconductor device according to claim 1, wherein said cooling device is provided on the upper portion of said reactor chamber.

5. An etching system for manufacturing a semiconductor device according to claim 4, wherein said temperature sensor is provided between said cooling device and said carbon electrode.

6. An etching system for manufacturing a semiconductor device according to claim 5, wherein said temperature sensor is provided between said cooling device and said carbon electrode through said heat-insulator.

7. An etching system for manufacturing a semiconductor device according to claim 6, wherein said carbon electrode is fixed on said cooling device using said heat-insulator.

8. An etching system for manufacturing a semiconductor device according to claim 1, wherein said cooling device is provided with an inlet and an outlet for supplying a refrigerant in the upper portion of said reactor chamber so that said refrigerant is circulated in said cooling device.

9. An etching system for manufacturing a semiconductor for manufacturing a semiconductor according to claim 8, where said temperature sensor is provided at a position corresponding to each of said refrigerant inlet and outlet.

10. An etching system for manufacturing a semiconductor device according to claim 8, wherein said heat-insulator is made of a material selected from ceramic, PTFE (polytetrafluoroethylene), and glass fiber.

11. An etching system for manufacturing a semiconductor device, comprising:

a carbon electrode provided in a reactor chamber;

a cooling device for cooling said carbon electrode;

at least two temperature sensors for detecting the temperature of said carbon electrode and providing detection signal outputs therefrom;

a heat-insulator provided in such a manner as to cover the outer peripheral portion of said temperature sensors for preventing said temperature sensors from being thermally affected by heat energy from other than said carbon electrode; and a controller, connected to said temperature sensors, for controlling said cooling device on the basis of said detection signals outputted from said temperature sensors.

12. An etching system for manufacturing a semiconductor device according to claim 11, wherein said carbon electrode is formed in a circular shape having a size larger than that of a lower electrode.

13. An etching system for manufacturing a semiconductor device according to claim 11, wherein said temperature sensors have respective mounting positions which are arranged to be circular.

14. An etching system for manufacturing a semiconductor device according to claim 11, wherein said cooling device is provided with an inlet and an outlet for supplying a refrigerant in the upper portion of said reactor chamber so that said refrigerant is circulated in said cooling device.

15. An etching system for manufacturing a semiconductor device, comprising:

a carbon electrode provided in a reactor chamber;

a cooling device for cooling said carbon electrode, said cooling device thermally coupled to said carbon electrode to effect cooling thereof;

at least one temperature sensor in thermal contact with said carbon electrode for detecting the temperature of said carbon electrode and for outputting a detection signal representative of the temperature of said carbon electrode;

a heat-insulator surrounding outer portions of said temperature sensor not in thermal contact with said carbon electrode for preventing said temperature sensor from being thermally affected by thermal energy from other than said carbon electrode; and a controller, connected to said temperature sensor, for controlling said cooling device on the basis of the detection signal outputted from said at least one temperature sensor.

16. The etching system for manufacturing a semiconductor device according to claim 15, wherein said controller further comprises a CPU.

17. The etching system for manufacturing a semiconductor device according to claim 15, wherein said cooling device includes a fluid flow channel therein through which cooling fluid flows.

18. The etching system device for manufacturing a semiconductor device according to claim 17, wherein said controller holds the temperature of the carbon electrode constant by controlling the temperature of the fluid flow in said cooling device.

* * * * *

UNITED STATES PATENT AND TRADEMARK OFFICE
CERTIFICATE OF CORRECTION

PATENT NO. : 5,916,411
DATED : June 29, 1999
INVENTOR(S) : Youichi NOGAMI

It is certified that error appears in the above-identified patent and that said Letters Patent is hereby corrected as shown below:

Column 5, Line 51, delete "for manufacturing a semiconductor"

Signed and Sealed this

Fourth Day of January, 2000

Attest:

Attesting Officer

*Acting Commissioner of Patents and Trademarks*